United States Patent
Chang et al.

(10) Patent No.: US 6,834,263 B2
(45) Date of Patent: Dec. 21, 2004

(54) NROM STRUCTURE

(75) Inventors: Yao Wen Chang, Hsinchu (TW); Tao Cheng Lu, Koashiung (TW); Wen Jer Tsai, Hualian (TW)

(73) Assignee: Macronix International Co., Ltd., Hsinchu (TW)

( * ) Notice: Subject to any disclaimer, the term of this patent is extended or adjusted under 35 U.S.C. 154(b) by 765 days.

(21) Appl. No.: 09/815,129

(22) Filed: Mar. 22, 2001

(65) Prior Publication Data

US 2002/0100011 A1 Jul. 25, 2002

(30) Foreign Application Priority Data

Jan. 19, 2001 (TW) ........................ 90101240 A

(51) Int. Cl.[7] .............................................. G06F 17/50
(52) U.S. Cl. .......................................... 703/15; 716/17
(58) Field of Search .............................. 703/13, 14, 15; 716/1, 17; 365/185.24; 438/258, 268; 257/331, 344

(56) References Cited

U.S. PATENT DOCUMENTS

| | | | | |
|---|---|---|---|---|
| 5,768,192 A | * | 6/1998 | Eitan ..................... | 365/185.24 |
| 5,966,603 A | * | 10/1999 | Eitan .......................... | 438/258 |
| 6,580,124 B1 | * | 6/2003 | Cleeves et al. ............. | 257/331 |
| 6,593,624 B2 | * | 7/2003 | Walker ........................ | 257/344 |
| 6,677,204 B2 | * | 1/2004 | Cleeves et al. ............. | 438/268 |

OTHER PUBLICATIONS

Tsai et al., W–J. Positive Oxide Charge–Enhanced Read Disturb in a Localized Trapping Storage Flash Memory Cell, IEEE Transactions on Electron Devices, vol. 51, No. 3, Mar. 2004, pp. 434–439.*

Lusky et al., E. Investigation of Channel Hot Electron Injection by Localized Charge–Trapping Nonvolatile Memory Devices, IEEE Transactions on Electron Devices, vol. 51, No. 3, Mar. 2004, pp. 444–451.*

Larcher et al., L. Impact of Programming Charge Distribution on Threshold Voltage and Subthreshold Slope of NROM Memory Cells, IEEE Transactions on Electron Devices, vol. 49, No. 11, Nov. 2002, pp. 1939–1946.*

Chang et al., Y–W. Modeling for the 2nd–Bit Effect of a Nitride–Based Trapping Storage Flash EEPROM Cell Under Two–Bit Operation, IEEE Electron Device Letters, vol. 25, No. 2, Feb. 2004, pp. 95–97.*

* cited by examiner

*Primary Examiner*—Russell Frejd
(74) *Attorney, Agent, or Firm*—J.C. Patents

(57) ABSTRACT

A macro model of a programmable NROM for simulating the characters of the NROM under programming operation. Charges are stored in a portion of the nitride material layer to for a charge trapped region when the NROM is programmed. A normal MOS symbol element and a short channel MOS symbol element are respectively represent a MOS without having the charge trapped region and a MOS with a charge trapped region. Moreover, the normal MOS symbol element is series with the short channel MOS symbol element, wherein a source of the short channel MOS symbol element is coupled with a drain of the normal MOS symbol element.

2 Claims, 4 Drawing Sheets

NROM STRUCTURE

CROSS-REFERENCE TO RELATED APPLICATION

This application claims the priority benefit of Taiwan application serial no. 90101240, filed Jan. 19, 2001.

BACKGROUND OF THE INVENTION

1. Field of Invention

The present invention relates to an NROM structure. More particularly, the present invention relates to a macro model of an NROM structure in simulating the real operation condition of the NROM.

2. Description of Related Art

With the development of the technology, the highly cost and largely occupied vacuum tube is replaced by the bi-polar transistor (BJT) with relatively low cost and high operation speed. However, the disadvantage of the BJT is huge energy consumption. Therefore, heat dissipation of the BJT become a main problem when the integration is increased. In order to solve the problem described above, the MOS is developed.

FIG. 1A is schematic, cross-sectional view of a conventional N-type MOS. The N-type MOS comprises a substrate 10, a source 12, a drain 14 and a gate electrode 16. Further, a Vsub, a Vs, a Vd and Vg are respectively applied on the substrate 10, the source 12, the drain 14 and the gate electrode 16. The substrate 10 can be a P-type substrate and the drain 14 and the source 12 can be N-type regions, for example. Also, gate electrode 16 is constructed by a metal layer or a polysilicon layer 20 and an underlayer, a gate oxide layer 18. In order to describe or simulate the operation of the MOS on the computer, the structure of the MOS is represented by circuit symbols. FIG. 1B is a circuit symbol of a conventional NMOS transistor.

FIGS. 1C and 1D are diagrams showing characteristics of the NMOS transistor. Since the source and the substrate of the NMOS are usually grounded, operation of the NMOS is controlled by the Vg and the Vd, wherein the Vg decides the switch state (on/off state) of the NMOS and the Vd decides the amount of the current passing through the drain, channel and source when the NMOS is opened. Therefore, as shown in FIG. 1C, the current Id in the NMOS is almost zero when Vg is smaller than Vt. Simultaneously, when Vg is larger than Vt, the current Id in the NMOS is proportionally increased with the Vg. As shown in FIG. 1D, under Vg1, Vg2 and Vg3 (while Vg1<Vg2<Vg3), Id is directly proportional to Vd when Vd is relatively small. When the Vd is increased to reach a saturated drain voltage, the Id is approaching to saturated situation.

Based on the characteristics provided by the curves in FIGS. 1C and 1D, various circuit characters of the NMOS shown in FIG. 1B can be simulated by the computer.

However, with the development of the different NMOS structure, the NROM structure, such as those shown in U.S. Pat. No. 5,966,603 and U.S. Pat. No. 5,768,192, become more complex than ever and the characters of those NROM with complex structure are quite different from the those of the single NMOS shown in FIGS. 1C and 1D. Therefore, the model structure basing on the factors of the single NMOS can not be used to explain the operation phenomenon of the NROM with complex structure. Hence, the NROM with complex structure can not be efficiently simulated by computer.

SUMMARY OF THE INVENTION

The invention provides a macro model of a programmable NROM for simulating the character of the NROM. The NROM comprises a substrate, a drain located in the substrate, a source located in the substrate and a gate electrode located on the substrate between the source and the drain. The gate electrode comprises a first oxide layer, a nitride material layer, a second oxide layer and a polysilicon layer. When the programmable NROM is under a forward reading operation mode, charges are trapped in the nitride material layer close to the drain to form a charge trapped region. The macro model of the NROM comprises a normal MOS symbol element and a short channel MOS symbol element. The normal MOS symbol element represents a first MOS without having the charge trapped region and the first MOS is constructed by a first gate electrode, a first drain and a first source. The short channel MOS symbol element represents a second MOS with the charge trapped region and the second MOS is constructed by a second drain, a second source coupled with the first drain and a second gate electrode coupled with the first gate electrode.

The invention provides a macro model of an NROM for simulating the character of the programmable NROM. The NROM comprises a substrate, a drain located in the substrate, a source located in the substrate and a gate electrode located on the substrate between the source and the drain. The gate electrode comprises a first oxide layer, a nitride material layer, a second oxide layer and a polysilicon layer. When the programmable NROM is under a reverse reading operation mode, charges are trapped in the nitride material layer close to the source to form a charge trapped region. The macro model of the NROM comprises a normal MOS symbol element and a short channel MOS symbol element. The normal MOS symbol element represents a first MOS without having the charge trapped region and the first MOS is constructed by a first gate electrode, a first drain and a first source. The short channel MOS symbol element represents a second MOS with the charge trapped region and the second MOS is constructed by a second source, a second drain coupled with the first source and a second gate electrode coupled with the first gate electrode.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
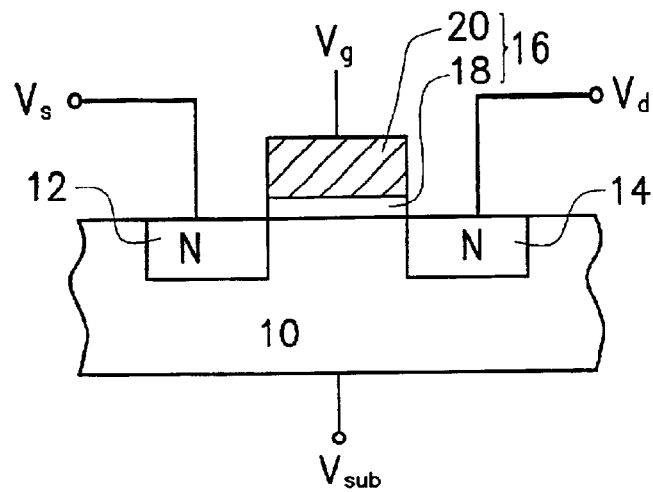
FIG. 1A is schematic, cross-sectional view of a conventional N-type MOS transistor.
Figure 1B:
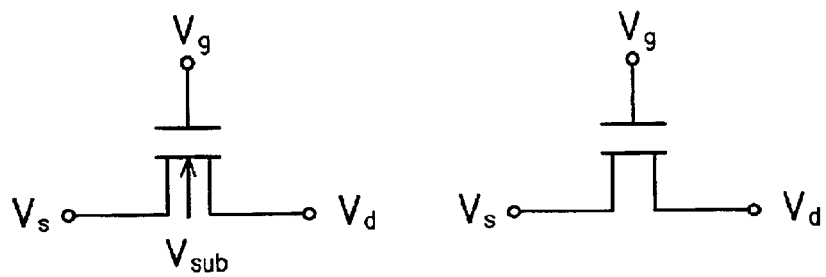
FIG. 1B is a circuit symbol of a conventional NMOS transistor.
Figure 1C:
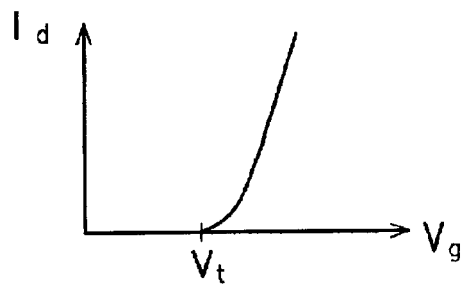
FIGS. 1C and 1D are diagrams showing characteristics of the NMOS transistor.
Figure 1D:
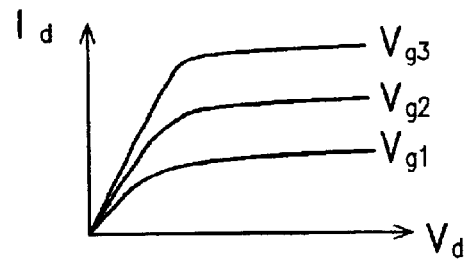
Figure 2:
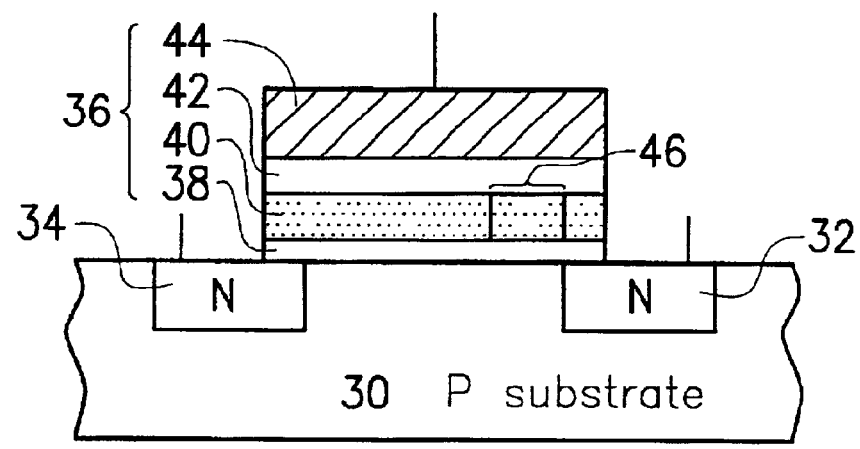
FIG. 2 is schematic, cross-sectional view of an NROM structure to be modeled in a preferred embodiment according to the invention.

FIG. 2 is schematic, cross-sectional view of an NROM for being modeled in a preferred embodiment according to the invention.

As shown in FIG. 2, a part of the NROM which is similar to the conventional MOS comprises a substrate 30, a drain 32 and a source 34. The substrate 30 can be a P-type substrate and the drain 32 and the source can be N-type doped regions formed by implanting N-type ions into the substrate 30. The difference between the NROM and the conventional MOS is a structure of a gate electrode 36 located on a portion of the substrate 30 between the drain 32 and the source 34. The gate electrode 36 is constructed by (from the bottom to the top) a first oxide layer 38, a nitride material layer 40, a second oxide layer 42 and a polysilicon layer 44. When a voltage is applied on the drain 32 to program the NROM, the implanted negative charges are trapped in the nitride material layer 40 to form a charge trapped region 46. The charge trapped region 46 is close to the drain 32 and the charge trapped region 46 only occupy a little part of the nitride material layer 46. Therefore, the channel located at charge trapped region 46 is relatively short. Moreover, because the negative charges are stored near the drain 32 so that the threshold voltage and the barrier around the drain 32 are relatively high. However, because of its short channel, the drain-induced-barrier-lowering (DIBL) effect is very serious. Therefore, the threshold voltage decreases with the increasing of $V_D$. Hence, the character curve of the NROM is quite different from that of the conventional NMOS. On the contrary, the character curve of a portion of the nitride material layer 40 without possessing the charge trapped region is similar to that of the conventional NMOS.

Figure 3:
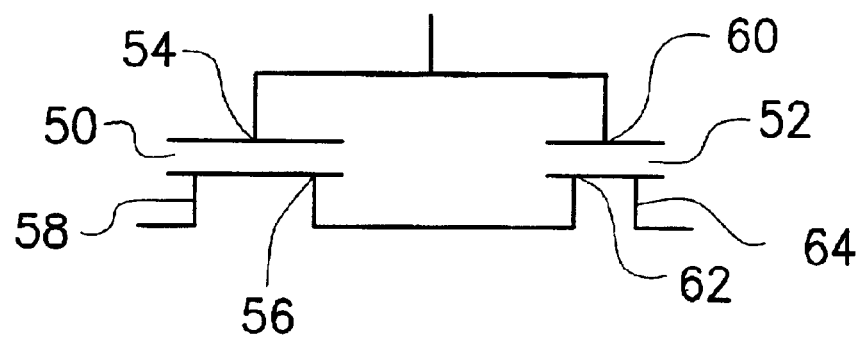
FIG. 3 is schematic of a macro model of an NROM structure in a preferred embodiment according to the invention.

FIG. 3 is schematic view of a macro model of an NROM structure in a preferred embodiment according to the invention. As shown in FIG. 3, since the left-hand part of the NROM shown in FIG. 2 is a normal NMOS structure and the right-hand part of the NROM is an NMOS transistor with short channel length, high threshold voltage and serious DIBL effect because of the existence of charge trapped region 46, a normal MOS symbol element 50 in serial with a short channel MOS symbol element 52 is used to represented the NROM structure described above. It should be noticed that a MOS possesses the channel shorter than the channel of the MOS symbol element 50 is regarded as a short channel MOS. In FIG. 3, the normal MOS symbol element 50 comprising a first gate electrode 54, a first drain 56 and a first source 58 represents a MOS constructed by the drain 32, the source 34 and the left portion of the gate electrode 36 without the existence of charge trapped region 46. Moreover, the short channel MOS symbol element 52 comprising a second gate electrode 60, a second drain 64 and a second source 62 represents a MOS constructed by the drain 32, the source 34 and the other portion of the gate electrode 36 with the charge trapped region 46.

Furthermore, since the normal MOS symbol element 50 and the short channel MOS symbol element 52 share a common gate electrode as the gate electrode 36 shown in FIG. 2, the first gate electrode 54 is coupled with the second gate electrode 60. In addition, by comparing FIG. 2 to FIG. 3, since the first drain 56 is, indeed, the second source 62 the first drain 56 is in series coupled with the second source 62.

Figure 4A:
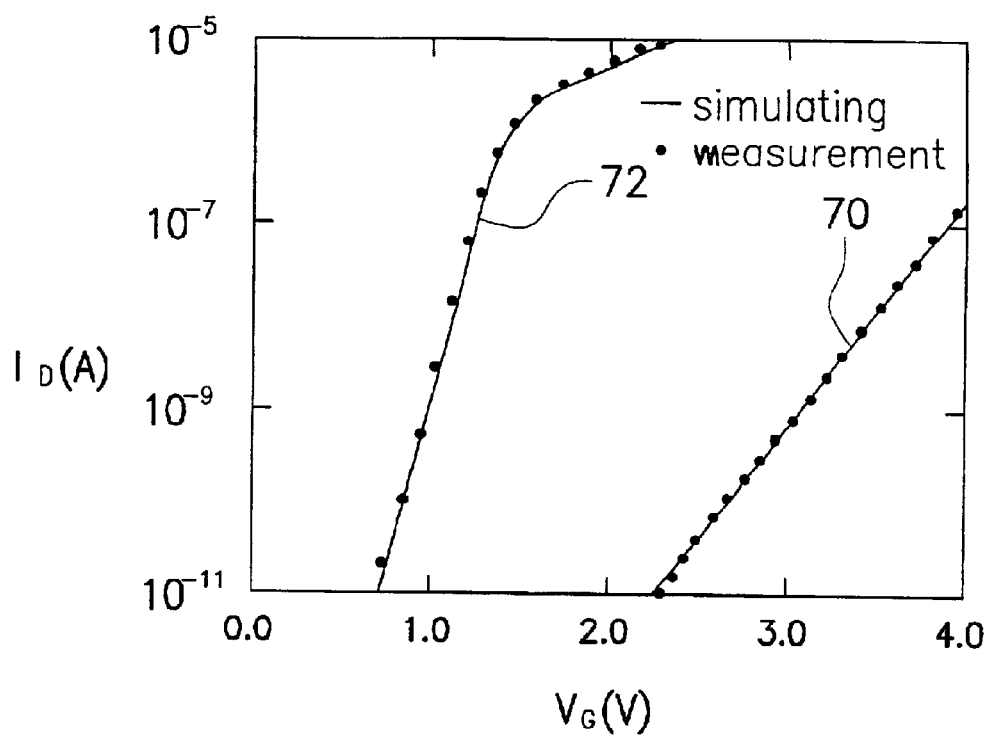
FIG. 4A, a plot of $I_D$ versus $V_G$, shows a character curve of an NROM structure under the forward reading operation mode.
Figure 4B:
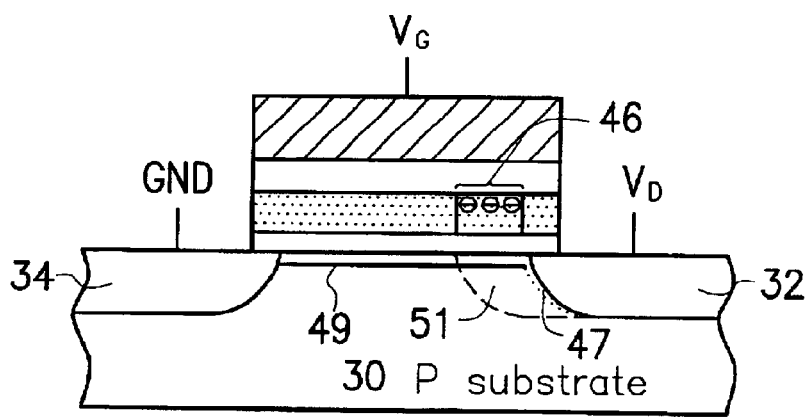
FIG. 4B is a schematic view of an NROM structure under a forward reading operation mode.
Figure 4B:
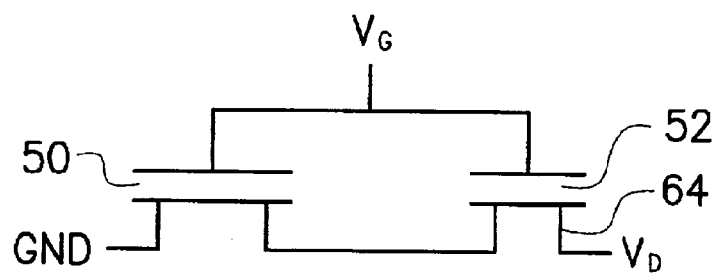

FIG. 4A, a plot of $I_D$ versus $V_G$, is a character diagram of an NROM under the forward reading operation. As shown in FIG. 4A together with FIG. 3, when the NROM is operated under a forward bias (as shown in FIG. 4B, a schematic of an NROM under a forward bias operation mode), a high voltage $V_D$ is applied on the drain 32 and the source 34 is grounded (GND). When the NROM is programmed, charges are stored in the nitride material layer to form the charge trapped region 46. Therefore, the short channel MOS symbol element 52 represents the correlating structure constructed by the drain 32, the source 34 and the portion of the gate electrode with the charge trapped region 46.

Moreover, a high voltage $V_D$ is applied on the second drain 64 and the first source 58 is grounded. If the applied voltage $V_D$ is relatively low ($V_D$=0.1V), a depletion region 47 formed in drain 32 is relatively small. Besides, because of the effect of the negative charges in the charge trapped region 46, there is no current flows through the channel 49 (as shown in FIG. 4B). As represented by curve 70 in FIG. 4A, the gate voltage $V_G$ is increased over a critical value (as shown in FIG. 4A) to eliminate the negative charge effect of the charge trapped region 46. Therefore, the current flowing through the channel is increased. The current can be well simulated because of the high threshold voltage of the short channel MOS 52. On the contrary, if the applied voltage $V_D$ is relatively high ($V_D$=2.1V), a depletion region 51 formed in drain 32 is relatively large even larger than the negative charge effect range of the charge trapped region 46. As represented by curve 72 in FIG. 4A, the negative charge effect of charge trapped region 46 can be eliminated under a relatively small $V_G$ (as shown in FIG. 4A). The current also can be well simulated because of the high DIBL effect of the short channel MOS 52. The threshold voltage decreases when $V_D$ is high. Therefore, the current flowing through the channel is increased.

Figure 5A:
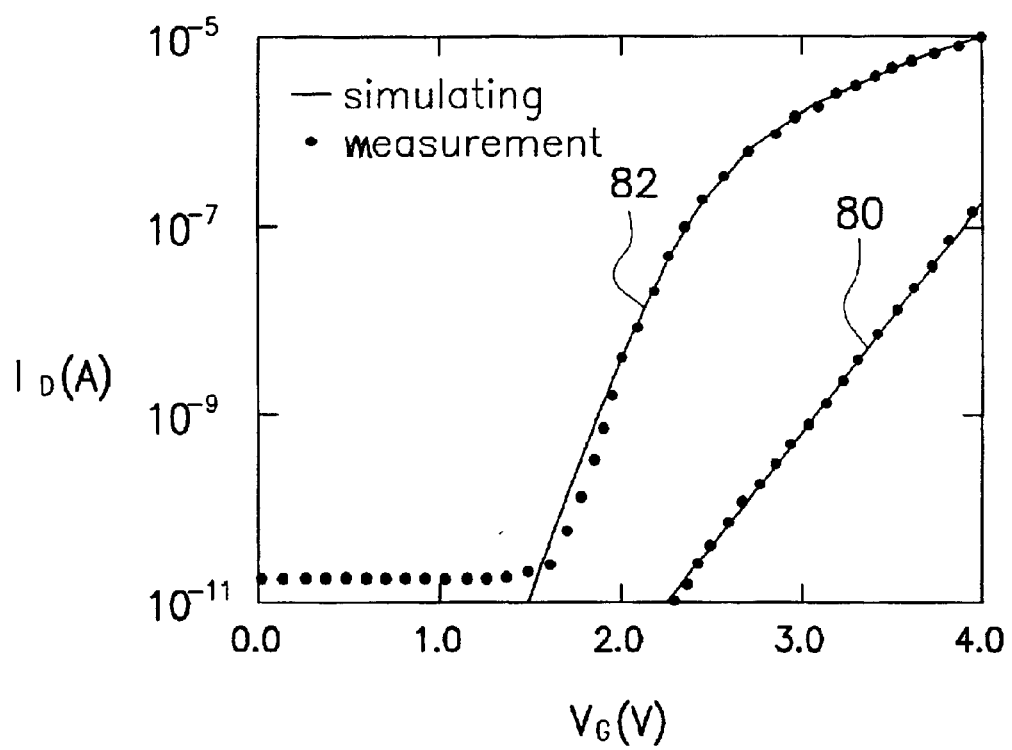
FIG. 5A a plot of $1_D$ versus $V_G$, shows a character curve of an NROM structure under the reverse reading operation mode.
Figure 5B:
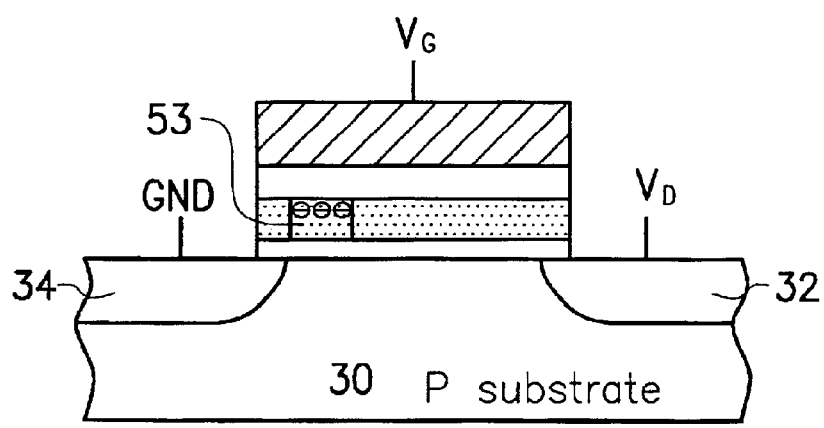
FIG. 5B is a schematic view of an NROM structure under a reverse reading operation mode.
Figure 5B:
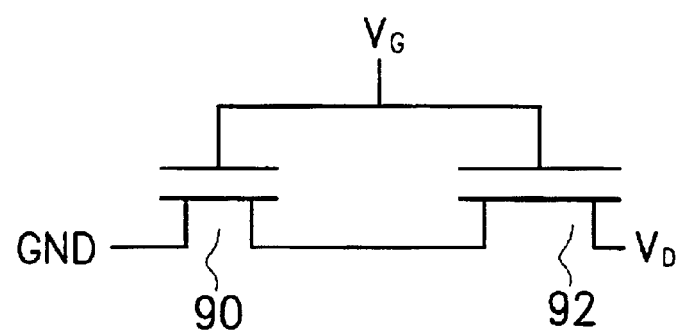

FIG. 5A a plot of $I_D$ versus $V_G$, is a character diagram of an NROM under the reverse reading operation. Under the reverse reading operation (as shown in FIG. 5B, a schematic of an NROM under a reverse bias operation mode), charges are stored in the nitride material layer 40 near the source 34 to form a charge trapped region 53 in the left-hand part of the NROM. Hence, left-hand part of the NROM is regarded as an NMOS with a relatively high threshold voltage and serious DIBL effect because of the existence of the charge trapped region near the source 34. On the other hand, since there is no charge trapped in the right-hand part of the NROM, the right-hand part of the NROM is regarded as a normal NMOS. By comparing the top schematic of FIG. 5B to the bottom schematic of FIG. 5B, the short channel MOS symbol element 90 series with the normal MOS symbol element 92 represents the cross-sectional view of the NROM. Because the normal MOS symbol element 92 and the short channel MOS symbol element 90 share a common gate electrode as the gate electrode 36 shown in FIG. 2, the gate electrodes of normal MOS symbol element 92 and the short channel MOS symbol element 90 are coupled with each other. Simultaneously, the drain of short channel MOS symbol element 90 is coupled with the source of the normal MOS symbol element 92.

As shown in FIG. 5B, when the NROM is operated under a reverse bias, charges are stored close to the source 34. The applied voltage $V_D$ at drain will not affect the performance of the short channel MOS symbol element 90 unless the normal MOS symbol element 92 is "on". Clearly, both normal MOS symbol element 92 and short channel MOS symbol element 90 could affect the performance of the NROM. Therefore, only when a high voltage $V_G$ is applied on the gate electrode even (as represented by curve 82 in FIG. 5A, $V_D$=2.1V), the normal MOS symbol element 92 and the short channel MOS symbol element 90 are turned on at the same time to generate a larger $I_D$. If the applied voltage $V_D$ is as low as the applied voltage $V_D$ ($V_D$=0.1 V) used in the forward bias operation mode, a relatively high $V_G$ (as shown by curve 80 in FIG. 5A, larger than 2.1 V) is necessary for inducing relatively large current $I_D$.

Altogether, no matter the operation mode is forward bias or reverse bias, the macro model of the NROM provided by the present invention can explain the operation characters by simple model symbols. Furthermore, based on the macro model, the character factors can be well established and the NROM can be further simulated by computer according to the character factors.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A macro model of a programmable NROM for simulating the character of the NROM, wherein the NROM comprises a substrate, a drain located in the substrate, a source located in the substrate and a gate electrode located on the substrate between the source and the drain, and the gate electrode comprises a first oxide layer, a nitride material layer, a second oxide layer and a polysilicon layer, when the programmable NROM is under a forward reading operation mode, charges are trapped in the nitride material layer close to the drain to form a charge trapped region, the macro model of the NROM comprising of:

a normal MOS symbol element for representing a first MOS without having the charge trapped region, wherein the first MOS is constructed by a first gate electrode, a first drain and a first source; and a short channel MOS symbol element for representing a second MOS with the charge trapped region, wherein the second MOS is constructed by a second drain, a second source coupled with the first drain and a second gate electrode coupled with the first gate electrode.

2. A macro model of a programmable NROM for simulating the character of the NROM, wherein the NROM comprises a substrate, a drain located in the substrate, a source located in the substrate and a gate electrode located on the substrate between the source and the drain, and the gate electrode comprises a first oxide layer, a nitride material layer, a second oxide layer and a polysilicon layer, when the programmable NROM is under a reverse reading operation mode, charges are trapped in the nitride material layer close to the source to form a charge trapped region, the macro model of the NROM comprising of:

a normal MOS symbol element for representing a first MOS without having the charge trapped region, wherein the first MOS is constructed by a first gate electrode, a first drain and a first source; and a short channel MOS symbol element for representing a second MOS with the charge trapped region, wherein the second MOS is constructed by a second source, a second drain coupled with the first source and a second gate electrode coupled with the first gate electrode.

* * * * *